US011340268B2

(12) United States Patent
Wriessnegger et al.

(10) Patent No.: US 11,340,268 B2
(45) Date of Patent: May 24, 2022

(54) ADD-ON CURRENT SENSOR FOR A POWER MODULE

(71) Applicant: Infineon Technologies AG, Neubiberg (DE)

(72) Inventors: Gerald Wriessnegger, Villach (AT); Leo Aichriedler, Puch (AT); Tomas Manuel Reiter, Munich (DE); Christoph Koch, Salzkotten (DE); Andreas Schenk, Lauben (DE); Johannes Hackl, Wiggensbach (DE); Volker Thorsten Schmidt, Buchenberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/948,489

(22) Filed: Sep. 21, 2020

(65) Prior Publication Data
US 2022/0091160 A1 Mar. 24, 2022

(51) Int. Cl.
*G01R 15/20* (2006.01)
*G01R 33/06* (2006.01)
*H02P 27/06* (2006.01)
*G01R 19/25* (2006.01)
*H02K 11/27* (2016.01)

(52) U.S. Cl.
CPC ......... *G01R 15/202* (2013.01); *G01R 15/207* (2013.01); *G01R 19/25* (2013.01); *G01R 33/06* (2013.01); *H02P 27/06* (2013.01); *H02K 11/27* (2016.01)

(58) Field of Classification Search
CPC .......... G01R 19/25; H02P 27/06; H02K 11/27
See application file for complete search history.

(56) References Cited

U.S. PATENT DOCUMENTS

| | | | |
|---|---|---|---|
| 7,360,300 B2* | 4/2008 | Carey | B82Y 10/00 216/62 |
| 2003/0081219 A1* | 5/2003 | Bennett | G01C 19/72 356/460 |
| 2012/0286720 A1* | 11/2012 | Fassnacht | B60L 1/006 320/105 |
| 2013/0265808 A1* | 10/2013 | Ishii | H02M 1/12 363/97 |
| 2014/0140119 A1* | 5/2014 | Shinohara | H05K 7/1432 363/141 |
| 2014/0176123 A1* | 6/2014 | Okumura | G01R 15/207 324/127 |
| 2019/0229640 A1 | 7/2019 | Aichriedler et al. | |

* cited by examiner

*Primary Examiner* — Alvaro E Fortich
(74) *Attorney, Agent, or Firm* — Harrity & Harrity, LLP

(57) ABSTRACT

A method may include pressing a sensor module onto a control board such that the sensor module is at an initial position where an air gap is present between a module body of the sensor module and the control board such that compliant pins of the sensor module are partially inserted into the control board. The method may include mounting the control board on a power module to cause pins of the power module to be at least partially inserted into the control board and the sensor module to be at least partially inserted in the power module such that a protrusion is through an opening in a busbar. The method may include pressing the control board onto the power module to cause the pins of the power module to be further inserted into the control board, the sensor module to be further inserted in the power module, and the sensor module to be at a final position.

20 Claims, 13 Drawing Sheets

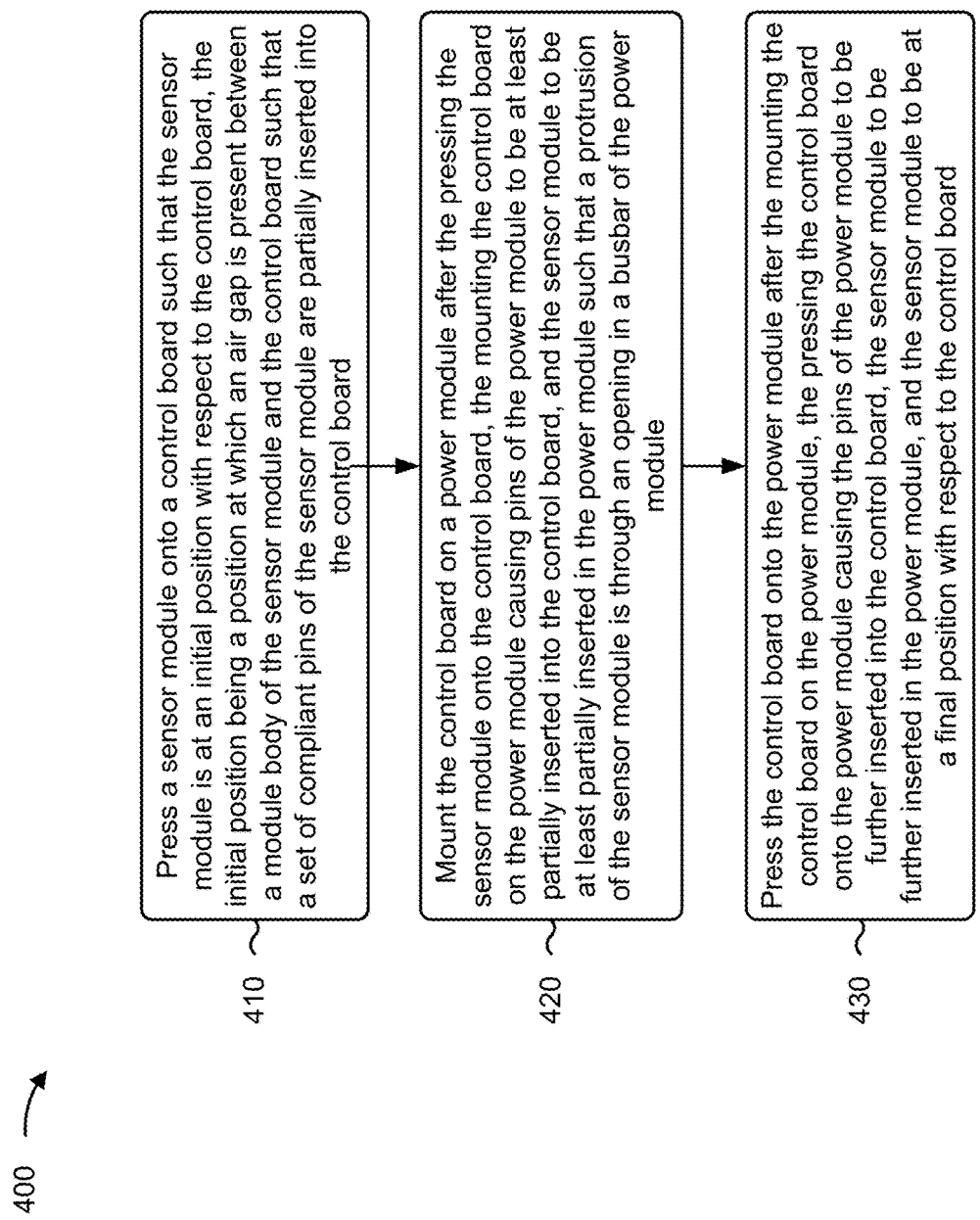

US 11,340,268 B2

ADD-ON CURRENT SENSOR FOR A POWER MODULE

BACKGROUND

In-phase current sensors may be used in a high power drive application to determine phase currents delivered by a power module to, for example, an electric motor. One implementation of such an in-phase current sensor uses a core-based principle of magnetic current sensing. Typically, a core-based in-phase current sensor is a magnetic sensor that implements a field concentrator (e.g., an iron core wrapped around a current rail) to concentrate a magnetic field produced by a current flowing through the current rail onto a magnetic sensing element such that a measurement can be obtained. Another implementation of an in-phase current sensor uses a core-less principle of magnetic current sensing. Typically, a core-less in-phase current sensor is a magnetic sensor that implements one or more sensing elements in proximity to a current rail such that a measurement can be obtained based on a magnetic field produced by a current flowing through the current rail as sensed by the one or more of sensing elements. Such an in-phase current sensor may be used, for example, in a direct current-to-alternating current (DC/AC) inverter, a DC/DC converter, an AC/DC converter, a DC/AC converter, an AC/AC converter, or the like.

SUMMARY

In some implementations, a method includes pressing a sensor module onto a control board such that the sensor module is at an initial position with respect to the control board, the initial position being a position at which an air gap is present between a module body of the sensor module and the control board such that a set of compliant pins of the sensor module are partially inserted into the control board; mounting the control board on a power module after the pressing the sensor module onto the control board, the mounting the control board on the power module causing pins of the power module to be at least partially inserted into the control board, and the sensor module to be at least partially inserted in the power module such that a protrusion of the sensor module is through an opening in a busbar of the power module; and pressing the control board onto the power module after the mounting the control board on the power module, the pressing the control board onto the power module causing the pins of the power module to be further inserted into the control board, the sensor module to be further inserted in the power module, and the sensor module to be at a final position with respect to the control board.

In some implementations, a sensor module includes a set of compliant pins on a first surface, the set of compliant pins being associated with providing a connection to a control board; and a module body including a protrusion on a second surface, a pivoting element on the second surface, and a third surface enabling tilting of the module body with respect to a busbar of a power module and insertion of the sensor module in the power module.

In some implementations, a device includes a printed circuit board control board; a power module including a busbar having an opening; and a sensor module including a set of compliant pins associated with providing a connection between the sensor module and the control board, and a sensor module body including a protrusion and a pivoting element, the protrusion being inserted through the opening in the busbar, and the pivoting element enabling tilting of the sensor module body with respect to the busbar.

BRIEF DESCRIPTION OF THE DRAWINGS

FIG. 4 is a flow chart of an example process for assembling a device including a power module, one or more add-on current sensors, and a control board described herein.

DETAILED DESCRIPTION

Figure 1:
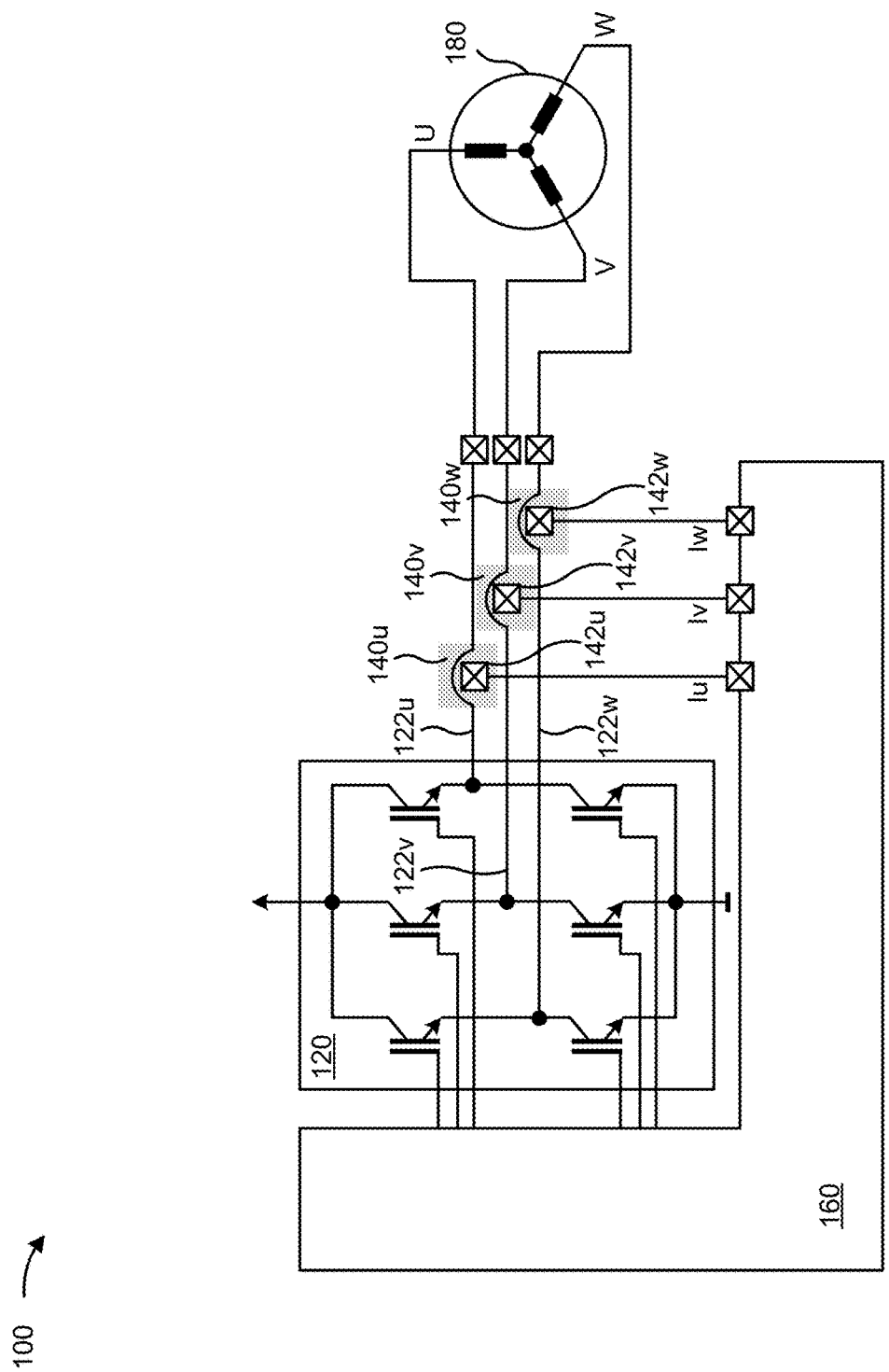
FIG. 1 is a schematic diagram illustrating an example of a motor control loop for a power module in which the add-on current sensor described herein may be implemented.

The following detailed description of example implementations refers to the accompanying drawings. The same reference numbers in different drawings may identify the same or similar elements.

In a high power drive application, in-phase current sensors can be used to determine phase currents delivered by a power module. However, implementing an in-phase current is challenging in a high power environment, which may include phase currents up to 10 kiloamps (kA), voltages up to 1200 volts (V), step voltage transients up to 15 kilovolts per microsecond (kV/µs) (e.g., in silicon (Si)) or 120 kV/µs (e.g., in silicon carbide (SiC)), voltage overshoots of more than 100 V, a requirement for safe isolation (e.g., basic insulation, reinforced insulation, or the like, depending on the application), a power density requirement (i.e., output power per volume), and/or the like. As noted above, an in-phase current sensor used in a high power drive application can be implemented using core-based or core-less principles. Notably, with increasing power densities and quantities of main or hybrid power inverters, a need for constructed space and cost optimized solution is increasing.

In practice, a power module should incorporate in-phase current sensing on a system level or as a stand-alone device in a peripheral area of high power interconnects of the power module. However, currently available power modules do not incorporate a current sensing feature directly, meaning that a customer needs to build solutions that incorporate in-phase current sensing on the system level. These customer-built solutions are typically based on (open-loop) core-based magnetic sensors, but can be based on core-less magnetic sensors. A number of issues result from relying on such customer-built solutions, such as high cost, complexity of assembly (e.g., when the solution requires a current rail to be routed through a field concentrator), power dissipation concerns (e.g., when using a closed-loop magnetic sensor due to a need of longer busbars), and a requirement for a constructed space. With core-based magnetic sensors in particular, there can be a number of other disadvantages, such as hysteresis effects, a non-linearity of a field concentrator, saturation effects, overload capability, and weight.

One solution to overcome the power density and assembly process related issues could be to incorporate current sensing into the power module itself. However, while a fully integrated and end-of-line tested current sensor may provide a suitable solution from a technical perspective and from the perspective of the end-user, the fully integrated solution may cause a number of issues with respect to logistics and manufacturing. Such issues include, for example, additional complexity of multiple current sensors within a power module being a threat of a cost sensitive yield loss of an entire power module, a logistics flow associated with implementing the fully integrated solution, and customer flexibility to be able to select different sensors to be integrated in a given power module.

Some implementations described provide techniques and apparatus for an add-on current sensor for a power module. As described in further detail below, the add-on current sensor is a sensor module that can be inserted into a sensor-ready power module. The power module and the sensor module are compatible, meaning that a sensing structure, which is conventionally implemented in a peripheral wiring (e.g., in a busbar) is incorporated into an output structure of the power module. In some implementations, during an assembly process, the sensor module is preassembled to a module control board, after which the module control board is mounted onto the power module. In this way, the sensor module can be assembled into a predefined opening in the power module. As described in further detail below, the design and assembly process associated with such an add-on current sensor overcomes the above-described issues associated with using an external sensor or a fully integrated sensor.

In some implementations, the use of add-on sensor modules described herein provides flexibility for selection of a current sensor with particular characteristics (e.g., supply voltage version, measurement range, bandwidth, and/or the like) for inclusion in a power module. Further, because individual add-on current sensors can be tested individually, an expected yield loss on the power module level is significantly reduced. Further, the use of add-on current sensors described herein is compatible with high volume manufacturing and assembly processes.

FIG. 1 is a schematic diagram illustrating an example of a motor control loop 100 for a power module in which the add-on current sensor described herein may be implemented. As shown in FIG. 1, the motor control loop 100 may include a power module 120, a set of add-on current sensors (herein referred to as sensor modules 140), and a control board 160. As shown, the motor control loop 100 may be further coupled to a three-phase motor 180 that includes three phases U, V, and W. Notably, while the example shown in FIG. 1 shows the power module 120 as a three-phase current generator configured to provide three-phase power by supplying three phase currents to drive the motor 180, other implementations are possible.

Three-phase power involves three symmetrical sine waves that are 120 electrical degrees out of phase with one another. For example, in a symmetric three-phase power supply system, three conductors each carry an alternating current of the same frequency and voltage amplitude (relative to a common reference), but with a phase difference of one-third the period. The common reference is typically connected to ground and to a current-carrying conductor referred to as the neutral. Due to the phase difference, the voltage on any conductor peaks at one-third of a cycle after one of the other conductors and one-third of a cycle before the remaining conductor. This phase delay gives constant power transfer to a balanced linear load. The phase delay also enables production of a rotating magnetic field in an electric motor and generation other phase arrangements using transformers. In a three-phase system feeding a balanced and linear load, a sum of instantaneous currents of the three conductors is zero. In other words, a current in each conductor is equal in magnitude to a sum of currents in the other two conductors, but with the opposite sign. A return path for the current in any phase conductor is the other two phase conductors. Deviations in magnitude and/or phase may cause a loss in power and torque in the motor 180. Therefore, the motor control loop 100 should be configured to monitor and control the magnitude and phase of the currents supplied to the motor 180 to ensure the proper current balance is maintained.

In this example, the power module 120 is coupled to a power supply (e.g., a battery) and is configured to regulate and supply a current to an output current rail for each phase of the motor 180. Thus, the power module 120 includes three output current rails. In some implementations, the power module 120 includes a separate driver circuit for each output, where each driver circuit is configured to generate an output current that is provided to a corresponding current rail. Thus, in this example, the power module 200 may include three driver circuits.

For the purpose of illustration, each current rail is represented as a current path 122 (e.g., current paths 122u, 122v, and 122w are shown in FIG. 1), and each current path 122 is coupled between an output of the power module 120 and a corresponding phase of the motor 180. As shown in FIG. 1, sensor modules 140 (e.g., sensor modules 140u, 140v, and 140w are shown in FIG. 1) are coupled to respective current paths 122. Each sensor module 140 may be a pre-assembled current sensor that is inserted into a frame of the power module 120 during assembly of the power module 120. Here, each sensor module 140 includes a respective magnetic sensor 142 (e.g., magnetic sensors 142u, 142v, and 142w are shown in FIG. 1). As shown, each magnetic sensor 142 is disposed in a corresponding current path 122. Each magnetic sensor 142 may in some implementations be placed within an opening (e.g., a hole or a slot) formed in each current rail to permit measurement a current flowing through the corresponding current rail. In some implementations, a given magnetic sensor 142 may be a differential Hall sensor configured to generate a sensor signal.

Current flowing through the current rails in an output direction (i.e., from the power module 120 towards a load) generates a magnetic field that can be measured by a magnetic sensor 142. The magnetic fields caused by the currents are directly proportional to the magnitude of each corresponding current. In particular, the measured magnetic field represents (i.e., is proportional to) a current density of a current flowing through a current rail. Thus, each magnetic sensor 142 may be configured to generate a sensor signal (e.g., a sensor signal) in response to a magnetic field impinging thereon, which is representative of the current density of a current passing through the corresponding current rail. In some implementations, each magnetic sensor 142 is configured to provide a sensor signal to the control board 160. In FIG. 1, each sensor signal is labeled as Iu, Iv, and Iw even though the sensor signal may in practice be a voltage value generated, for example, by a Hall sensor.

The control board 160 is a component configured to receive sensor signal provided by the magnetic sensors 142 and control the power module 120 based on the sensor signals. That is, the control board 160 may be configured to provide control to the power module 120 based on the measurement value of the sensor signals, and the power module 120 may regulate the currents based on feedback from the control board 160. In this way, the motor control loop 100 may be configured to maintain the proper current balance supplied to the motor 180. In some implementations, the control board 160 may be a printed circuit board (PCB) or another type carrier material suitable to accept a sensor module 140 and provide routing and/or electrical connection for the sensor module 140, such as an integrated metal substrate (IMS), a ceramic substrate, a lead frame, a stamped lead frame, and/or the like.

As indicated above, FIG. 1 is provided as an example. Other examples may differ from what is described with regard to FIG. 1. For example, while FIG. 1 illustrates an example of a DC/AC inverter, another type of power electronics converter is possible, such as a DC/DC converter, an AC/DC converter, a DC/AC converter, an AC/AC converter, or the like. Further, the number and arrangement of components shown in FIG. 1 are provided as examples. In practice, there may be additional components, fewer components, different components, or differently arranged components than those shown in FIG. 1.

Figure 2A:
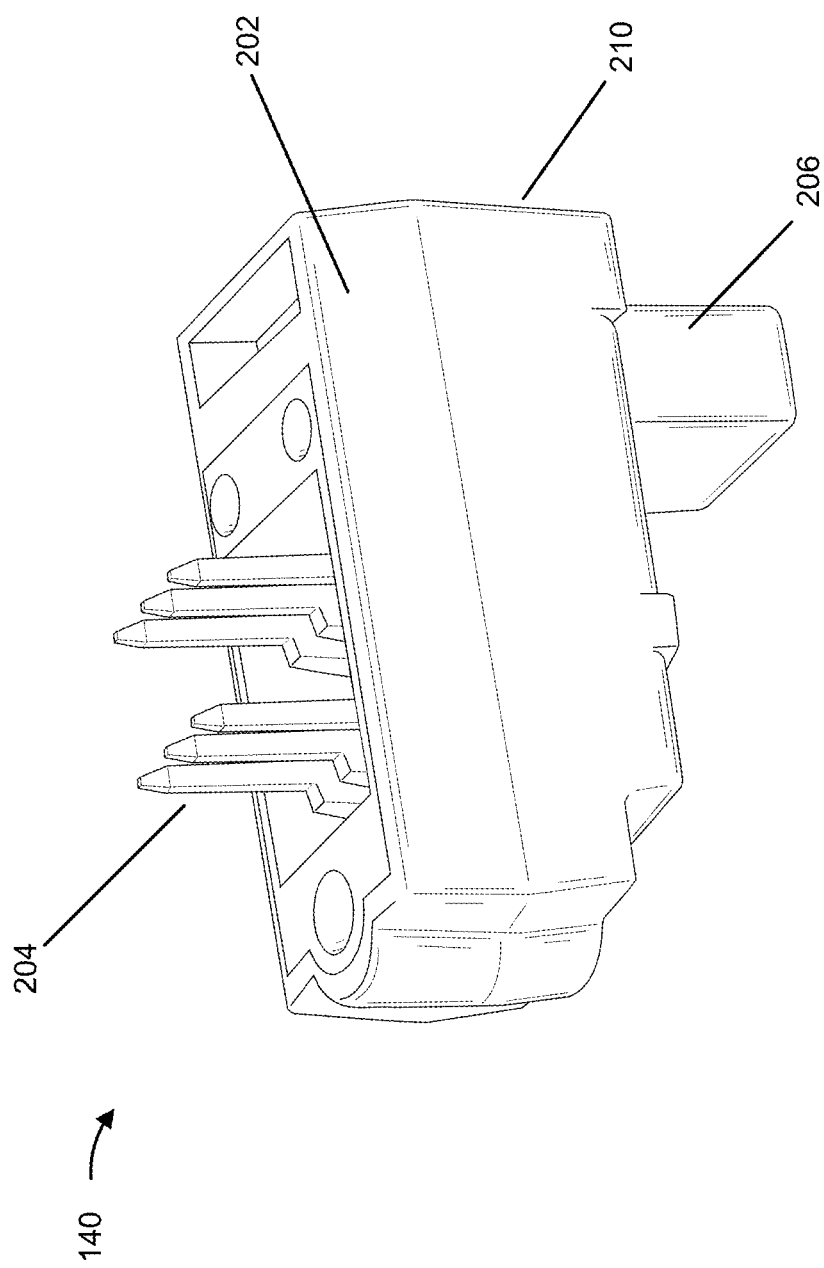
FIGS. 2A-2F are diagrams illustrating diagrams illustrating examples of an add-on current sensor and a power module described herein.
Figure 2B:
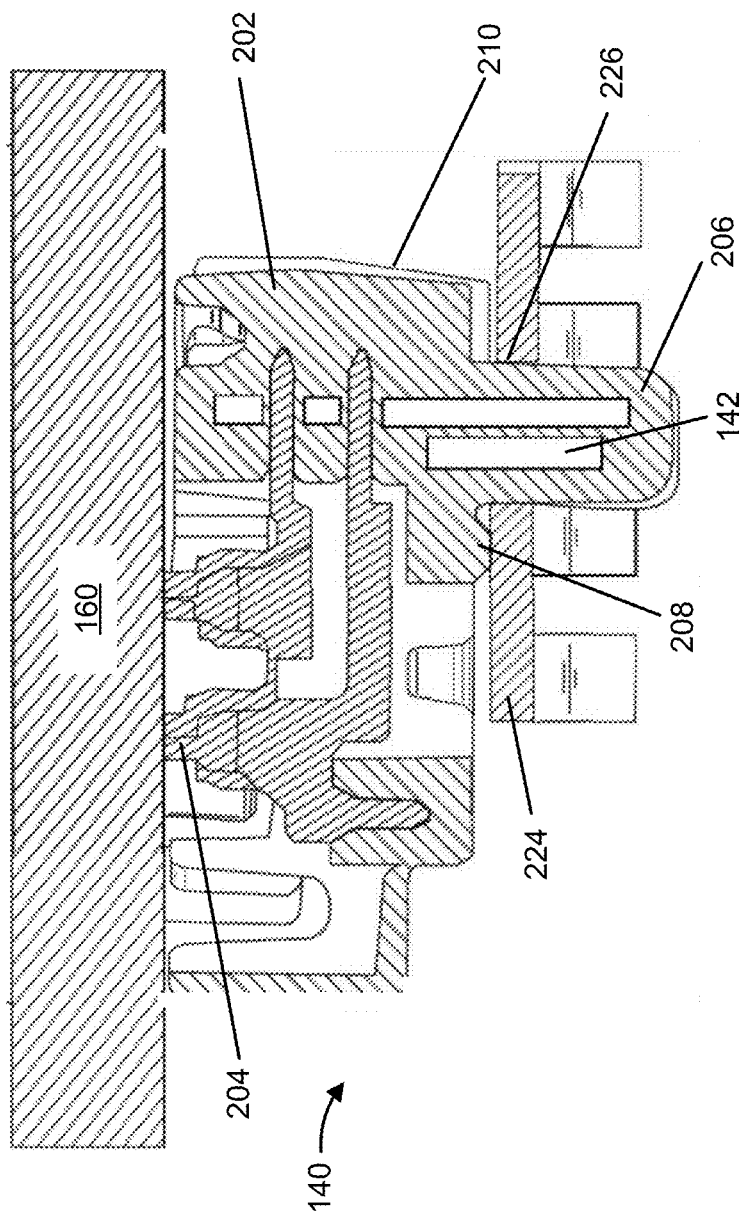
Figure 2C:
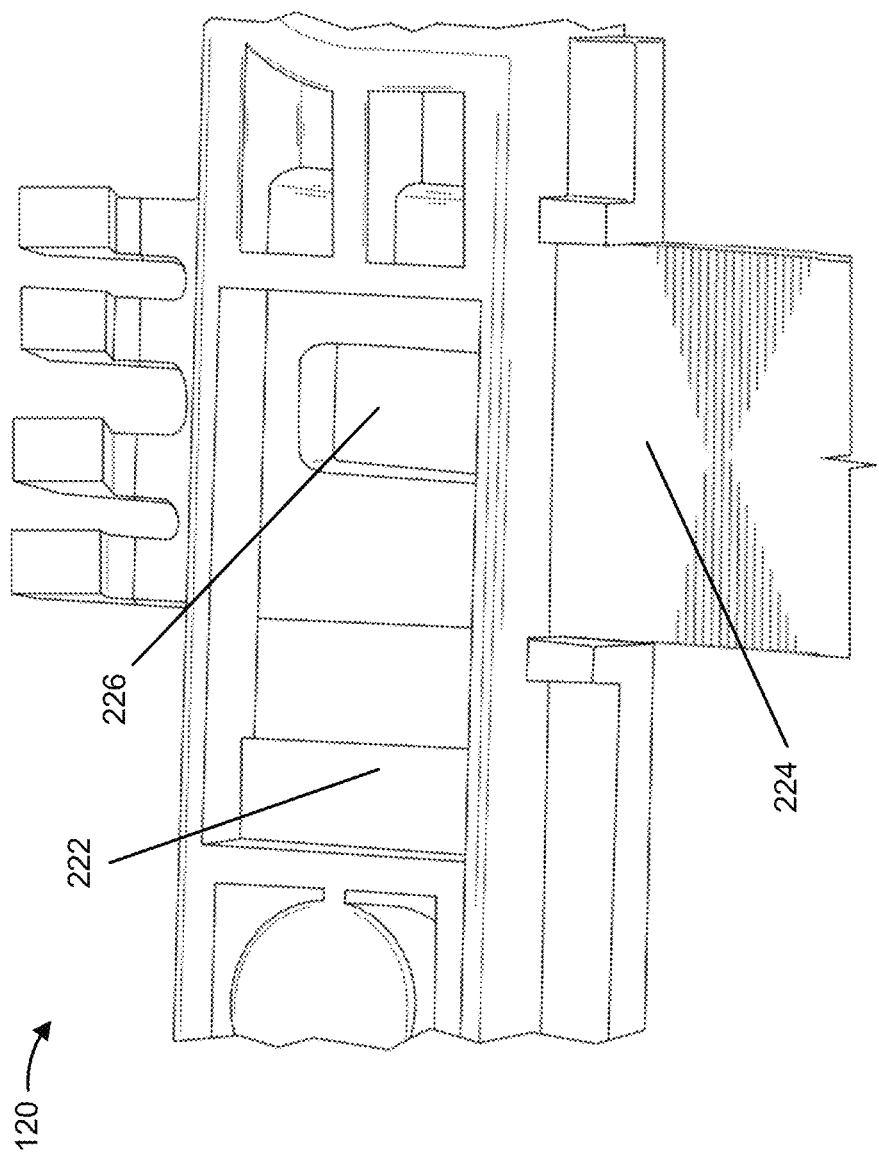
Figure 2D:
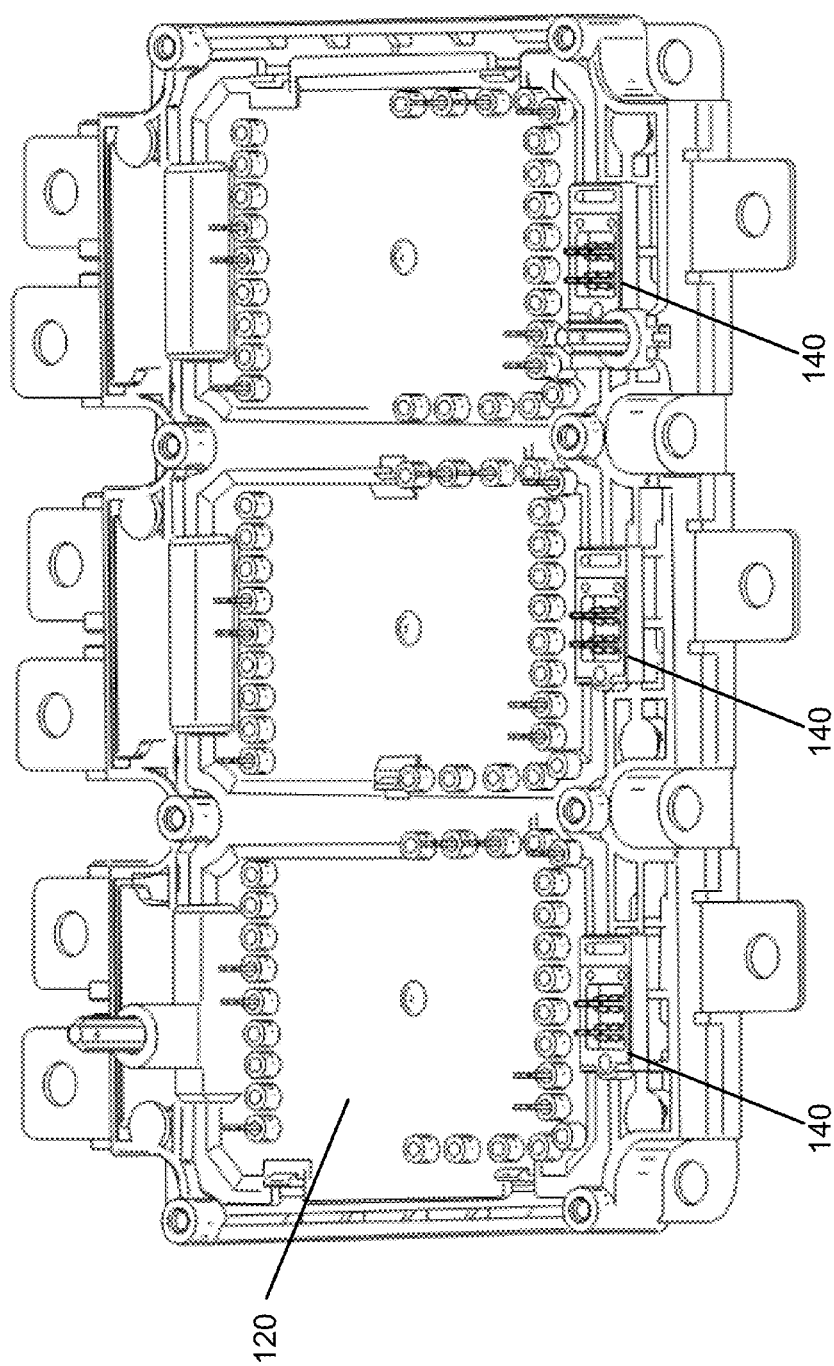

FIGS. 2A-2F are diagrams illustrating examples of the sensor module 140 and the power module 120 described herein. FIGS. 2A and 2B illustrate an isometric view and a cross-sectional view of an example sensor module 140, respectively. As shown in FIGS. 2A and 2B, the sensor module 140 may include a module body 202 and a set of compliant pins 204. FIGS. 2C and 2D are diagrams illustrating an example of the power module 120. As shown in FIGS. 2C and 2D, the power module 120 may include a frame 222 through which busbars 224 (e.g., current rails) pass. As shown in FIG. 2C, the frame 222 of the power module 120 includes sockets in which sensor modules 140 can be inserted. As further shown, the busbars 224 include respective openings 226 through which portions of sensor modules 140 are to be inserted when the sensor modules 140 are inserted into the sockets of the frame 222. Notably, the openings 226 are not visible in FIG. 2D because sensor modules 140 are shown as being inserted in the frame 222 of the power module 120 in FIG. 2D.

With reference to FIGS. 2A and 2B, the module body 202 comprises a structure that acts to house a magnetic sensor 142 (e.g., a set of components that form a magnetic current sensor, including a set of sensing elements such as set of Hall elements). In some implementations, the module body 202 or the magnetic sensor 142 itself may be a plastic encapsulated package (e.g., a leaded package, a leadless package, a surface mounted device (SMD)-package, and/or the like). In some implementations, the set of components of magnetic sensor 142 form an in-phase current sensor. For example, the magnetic sensor 142 may be a core-less magnetic sensor associated with detecting a magnetic field correlated to an amount of current in the busbar 224. Thus, the magnetic sensor 142 may be coupled to a magnetic field generated by current in the busbar 224 and contactless current measurement can be accomplished by using the magnetic sensor 142 to sense the magnetic field caused by the current passing through the busbar 224. In some implementations, the magnetic sensor 142 acts to receive a sensor signal from one or more sensing elements (e.g., Hall elements) in the form of raw measurement data and derive, from the sensor signal, a measurement signal that represents the magnetic field. In some implementations, in association with performing a measurement of the, the magnetic sensor 142 may perform signal conditioning, conversion from analog to digital (e.g., via an analog-to-digital converter (ADC)), amplification, filtering, biasing, range matching, isolation, and/or one or more other operations. In some implementations, the magnetic sensor 142 includes ADCs that convert the analog signal from the one or more sensor elements to a digital signal, a digital signal processor (DSP) that performs some processing on the digital signal, and/or one or more other components. In some implementations, the magnetic sensor 142 is a Hall-effect sensor (i.e., a Hall sensor), but is not limited thereto.

In some implementations, as shown in FIGS. 2A and 2B, the module body 202 may include a protrusion 206 on a surface of surface of the module body 202 (e.g., a bottom surface of the module body 202 as shown in FIG. 2A). In some implementations, the magnetic sensor 142 may be arranged in the protrusion 206 of the module body 202 such that the magnetic sensor 142 can be positioned in an opening 226 of the busbar 224 of the frame 222 of the power module 120. In some implementations, a size of the protrusion 206 is selected so as to permit the protrusion 206 to be inserted in the opening 226 in the busbar 224. In some implementations, a size of the protrusion 206 causes a press fit of the protrusion 206 in the opening 226 of the busbar 224 while the sensor module 140 is at a final position with respect to the control board 160 during assembly of the power module 120. In some implementations, the protrusion 206 houses isolation material associated with electrically isolating a set of sensing elements of the magnetic sensor 142 from the busbar 224.

As shown in FIG. 2B, the module body 202 may further include a pivoting element 208. In some implementations, as shown in FIG. 2B, the pivoting element 208 is on the same surface of the module body 202 as the protrusion 206 (e.g., the bottom surface of the module body 202). In some implementations, during assembly of the power module 120, the pivoting element 208 acts to enable tilting of the module body 202 with respect to the busbar 224 of the power module 120 when the sensor module 140 is at the final position with respect to the control board 160. In some implementations, the pivoting element 208 may take the form of, for example, a portion of a sphere (e.g., a half-sphere), a portion of a cylinder (e.g., a half-cylinder), or another type of rounded or angled surface protrusion that enables tilting of the module body 202 with respect to the busbar 224.

In some implementations, another surface of the module body 202 (e.g., a right side surface as shown in FIG. 2B) may enable tilting of the module body 202 with respect to the busbar 224 and/or insertion of the sensor module 140 in the power module 120. For example, the surface of the module body 202 may comprise an angled element (e.g., an angled facet) that enables the tilting of the module body 202 with respect to the busbar 224 and the insertion of the sensor module 140 in the power module 120. Additionally, or alternatively, the surface of the module body 202 may enable the tilting of the module body 202 with respect to the busbar 224 and the insertion of the sensor module 140 in the power module 120 by interacting with an angled element (e.g., an angled facet) in the frame 222 of the power module 120. In other words, in some implementations, the module body 202 and/or the frame 222 may be designed so as to facilitate tilting of the module body 202 with respect to the busbar 224 and/or insertion of the sensor module 140 in the power module 120, where the tilting and/or the insertion is facilitated by sliding of the surface of the module body 202 along the frame 222 (e.g., as the sensor module 140 is being pressed into the frame 222 of the power module 120).

The set of compliant pins 204 is a set of pins associated with connecting the magnetic sensor 142 of sensor module 140 to control board 160. In some implementations, the set of compliant pins 204 is arranged on a first surface of the module body 202 (e.g., a top surface of module body 202 as shown in FIG. 2A). In some implementations, one or more compliant pins 204 of the set of compliant pins 220 are elastically deformed and, in some cases, partially plastically deformed while the sensor module 140 is at an initial position with respect to the control board 160 during assembly of the power module 120. In some implementations, one or more compliant pins 220 of the set of compliant pins 220 are further plastically deformed while the sensor module 140 is at the final position with respect to the control board 160 (e.g., as compared to a degree of plastic deformation at the initial position of the sensor module 140 with respect to the control board 160). Here, the further plastic deformation of the one or more compliant pins 220 may provide a gas tight cold welding connection.

In some implementations, the set of compliant pins 204 and/or the pivoting element 208 act to provide compensation for a mechanical tolerance associated with assembling the power module 120. The mechanical tolerances may be associated with, for example, aligning pins of the power module 120 with respect to the set of compliant pins 204 of the sensor module 140, aligning the sensor module 140 with respect to the opening 226, aligning the opening 226 with respect to the pins of the power module 120, or aligning the busbar 224 with respect to another busbar 224 of the power module 120.

Figure 2E:
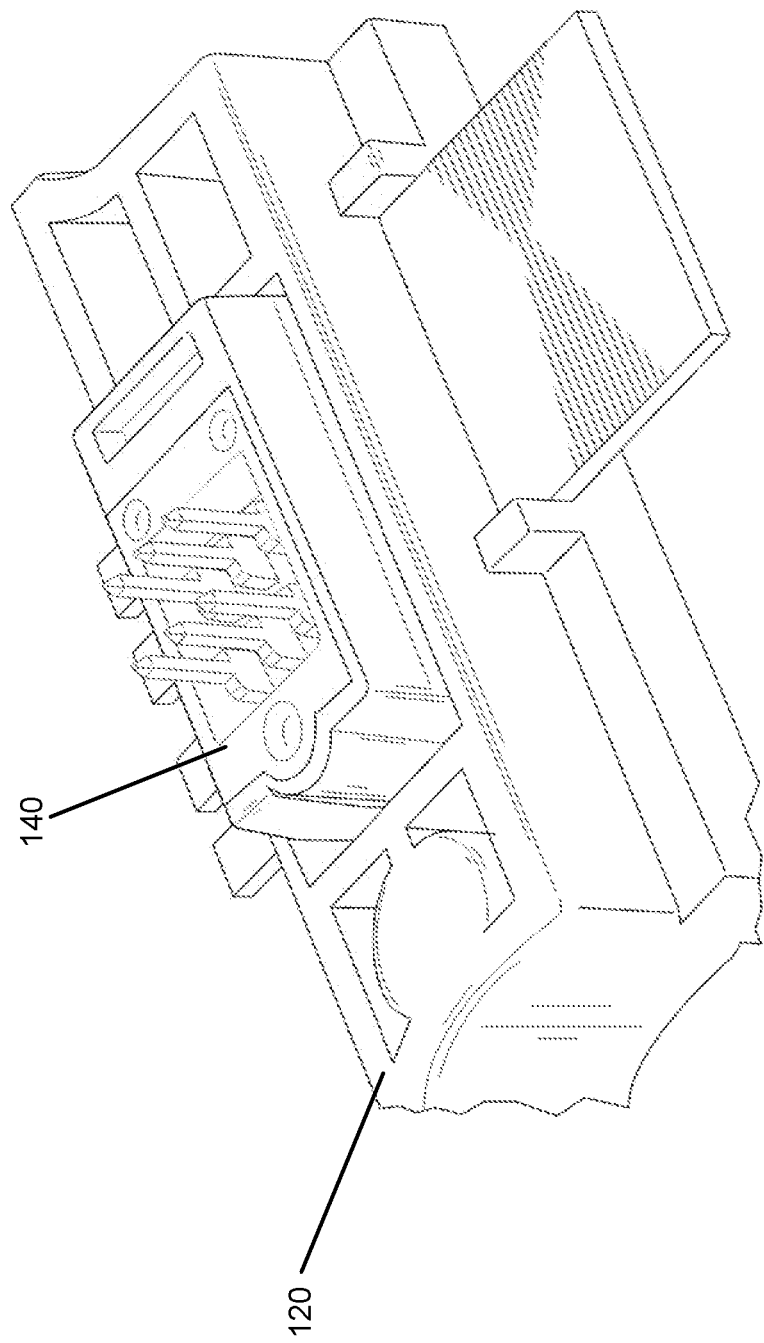
Figure 2F:
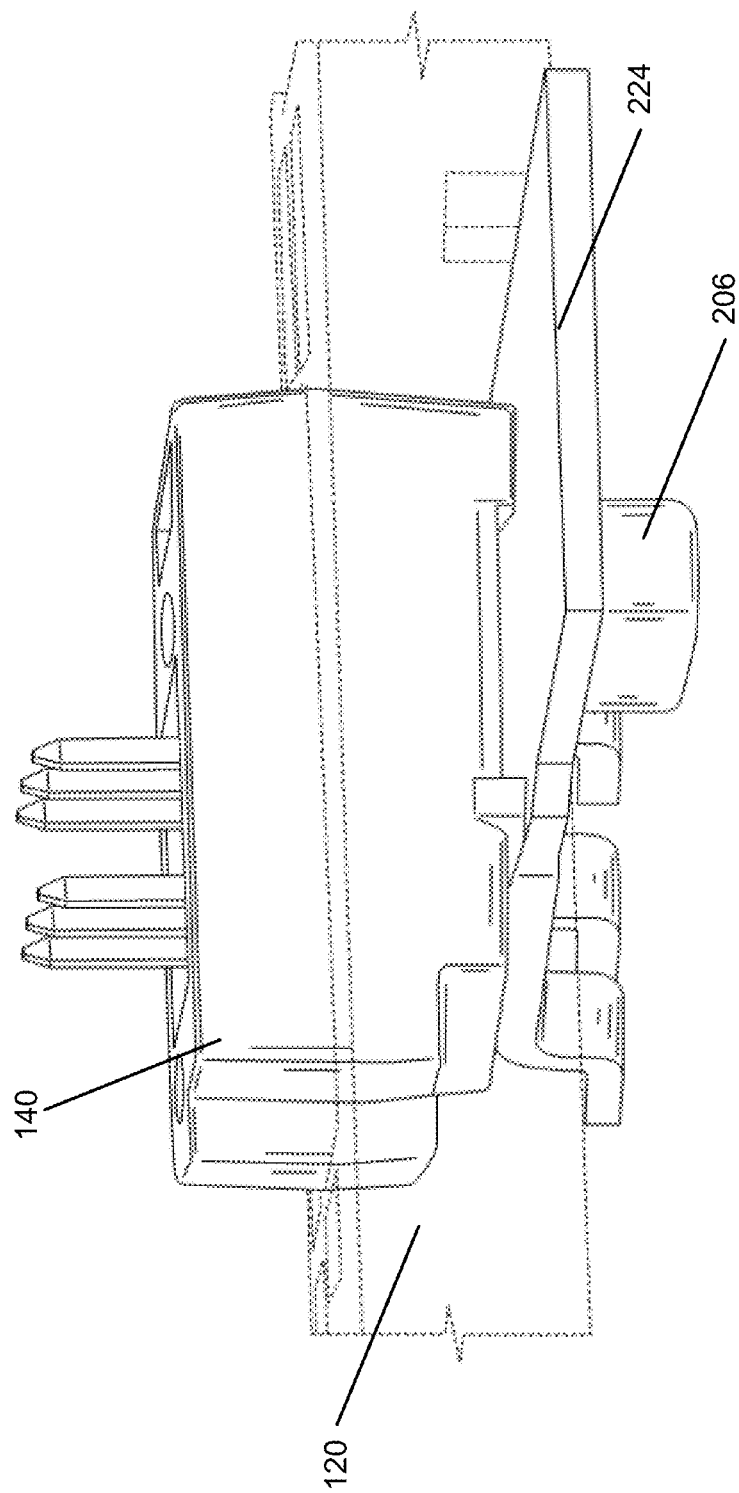

FIGS. 2E and 2F are diagrams illustrating a manner in which the sensor module 140 may fit within the frame 222 of the power module 120 (e.g., such that the protrusion 206 is press fit with the busbar 224 via the opening 226). A process for assembling a device including the power module 120, one or more sensor modules 140, and the control board 160 is illustrated below by FIGS. 3A-3E.

As indicated above, FIGS. 2A-2F are provided as examples. Other examples may differ from what is described with regard to FIGS. 2A-2F. Further, the number and arrangement of devices shown in FIGS. 2A-2F are provided as examples. In practice, there may be additional devices, fewer devices, different devices, or differently arranged devices than those shown in FIGS. 2A-2F.

Alignment of the power module 120, the sensor modules 140, and the control board 160 is needed when assembling the power module 120. During assembly of the power module 120, the control board 160 could be pressed (e.g., from the top side) onto the power module 120. However, in this assembly step, pins of the power module 120 and compliant pins 204 of the sensor modules 140 must be aligned in a way that receiving holes in the control board 160 will hit pin tips of the power module 120 and the sensor modules 140. Thus, different coordinate systems and the calculation of resulting positioning tolerances of the pins of the sensor module 140 need to be considered. These tolerances may include, for example, a mechanical tolerance of pins of the power module 120 with respect to the set of compliant pins 204 of the sensor module 140, a mechanical tolerance of the sensor module 140 with respect to the opening 226, a mechanical tolerance of the opening 226 with respect to the pins of the power module 120, a mechanical tolerance of the busbar 224 with respect to another busbar 224 of the power module 120, a mechanical tolerance between compliant pins 204 of each sensor module 140, and a mechanical tolerance between pins of the power module 120.

These tolerances can result in a total misalignment of the pins of the power module 120 versus compliant pins 204 of a sensor module 140 of on the order of a few millimeters (mm), such as approximately ±1.3 mm. Therefore, preassembly of the sensor modules 140 in the power module 120 as mentioned above may not be an option, as this would make aligning the compliant pins 204 of the sensor module 140 to the pins of the power module 120 impossible. Instead, the sensor modules 140 may be pre-assembled onto the control board 160 (e.g., such that the sensor module 140 is at an initial position with respect to the control board 160). The sensor modules 140 can then be inserted into the frame 222 of the power module 120. In some implementations, to maintain an accurate placing of the sensor module 140 into the power module 120, a multi-step assembly process is proposed. In a first step, one or more sensor modules 140 are preassembled on the control board 160 such that the one or more sensor modules 140 are at an initial position with respect to the control board 160. The initial position is a position at which an air gap is present between the one or more sensor modules 140 and the control board 160. Here, the compliant pins 204 act to provide a press fit connection and, due to the flexibility of the press fit connection, the sensor module 140 will slide into a final position during assembly of the control board 160 on the power module 120. A key point of this process is that a position of the sensor module 140 in the frame 222 of the power module 120 is the driving source for the movement of the sensor module 140 into the final position. Therefore, the sensor module 140 is forced into a desired position and a press fit connection, enabled by the compliant pins 204, is used for compensating the positioning tolerances described above. FIGS. 3A-3E provide a detailed illustration of the above described assembly process.

FIGS. 3A-3E are diagrams illustrating assembly of a device including the power module 120, one or more sensor modules 140, and a control board 160 described herein.

Figure 3A:
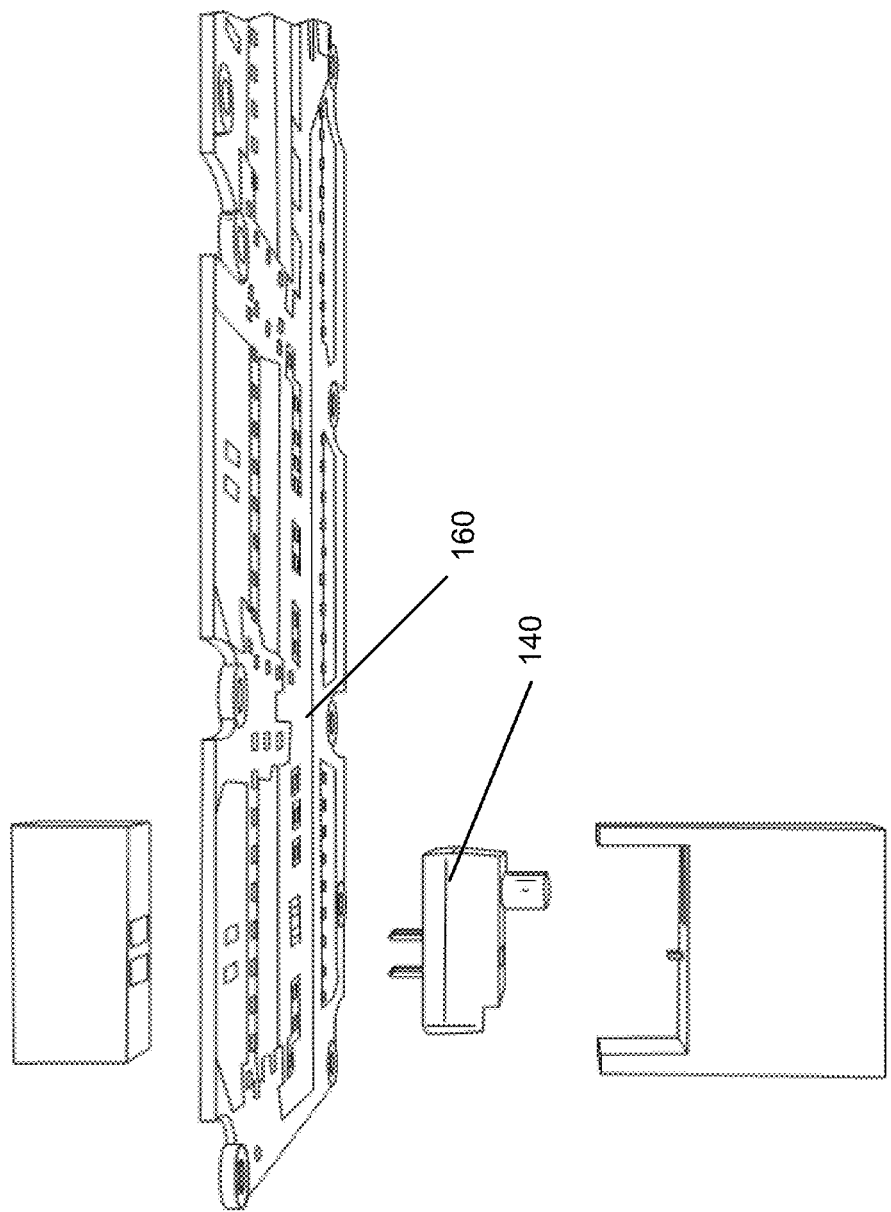
FIGS. 3A-3E are diagrams illustrating assembly of a device including a power module, one or more add-on current sensors, and a control board described herein.
Figure 3B:
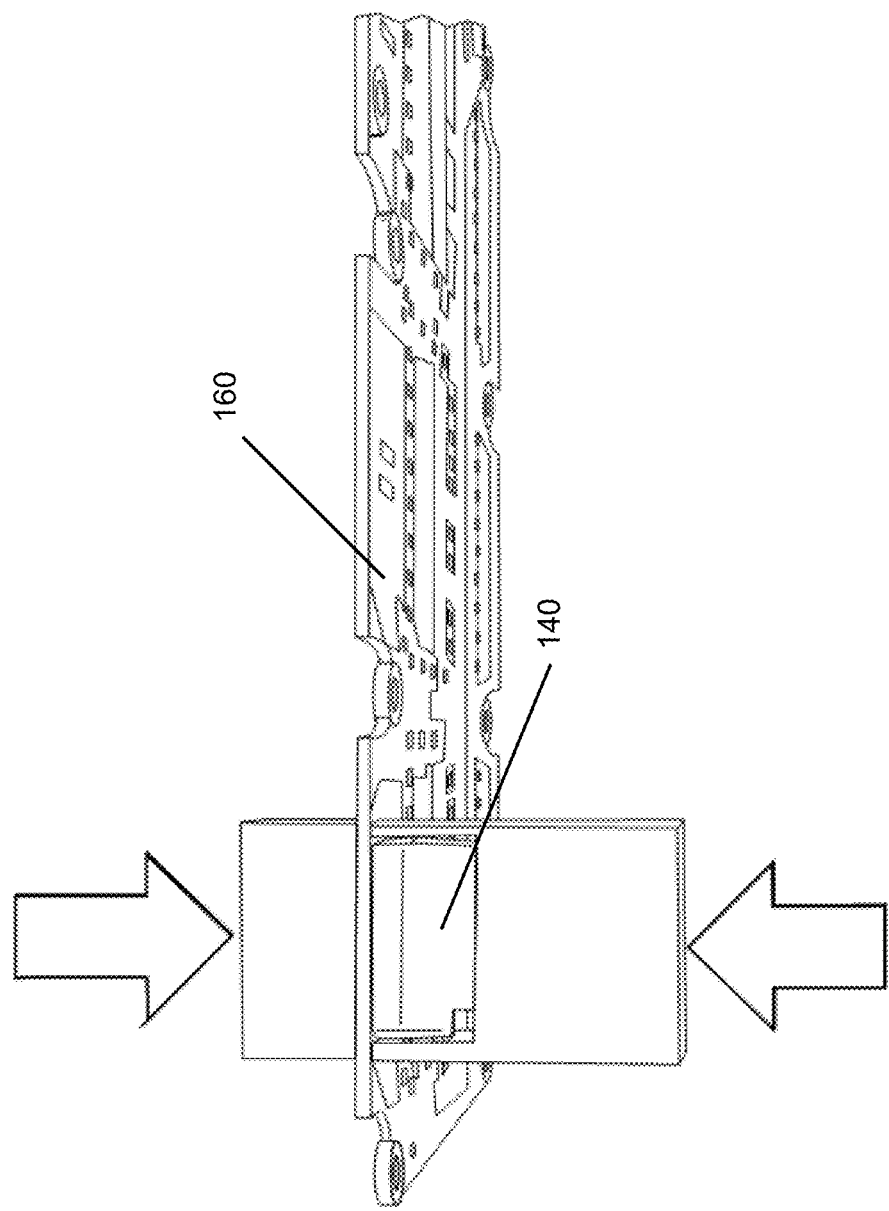

As shown in FIG. 3A, the one or more sensor modules 140 and the control board 160 may be provided for assembly. Here, the control board 160 includes all required SMD components (e.g., the control board 160 may be fabricated using a standard reflow process). In a first assembly step, as shown in FIG. 3B, the one or more sensor modules 140 (each including a set of compliant pins 204) are pressed into the control board 160. In some implementations, the each of the one or more sensor modules 140 may be pressed into the control board 160 individually (i.e., one at a time). Alternatively, two or more of the sensor modules 140 may be pressed into the control board 150 simultaneously (e.g., at the same time). Notably, while a single sensor module 140 is shown in FIGS. 3A and 3B, this assembly step can be similarly performed for one or more additional sensor modules 140.

In some implementations, the one or more sensor modules 140 are pressed into the control board 160 (e.g., by an assembly tool) such that the one or more sensor modules 140 are at an initial position with respect to the control board. As indicated in FIG. 3B, the initial position is a position at which an air gap is present between the module body 202 of the sensor module 140 and the control board 160. At the initial position, the set of compliant pins 204 of the sensor module are 140 are partially inserted into the control board 160. In some implementations, one or more compliant pins 204 of the set of compliant pins 204 are elastically deformed (e.g., forming a spring contact) and, in some cases, are partially plastically deformed while the sensor module 140 is at the initial position.

In some implementations, a size of the air gap may be predefined (e.g., the assembly tool may be configured to press the one or more sensor modules 140 into the control board 160 such that an air gap of a predetermined size is maintained). In some implementations, the size of the air gap may be approximately 100 micrometers ($\mu$m) and 500 $\mu$m less than a thickness of the control board 160. For example, when the thickness of the control board 160 is 1.6 mm, the size of the air gap may be in a range from approximately 1.5 mm to approximately 1.0 mm. In general, the size of the air gap may be selected so as to control plastic deformation of the set of compliant pins 204 (e.g., such that a degree of plastic deformation is minimized or is relatively small). Notably, the one or more sensor modules 140 are not fully pressed into the control board 160 at this step, but are sufficiently connected to the control board 160 so as to remain in position with respect to the control board 160 during the assembly steps that follow.

In some implementations, in a next assembly step, the control board 160 is aligned to the power module 120. Thus, in some implementations, the control board 160 is aligned to the power module 120 after the pressing the sensor module onto the control board 160 (and before mounting the control board 160 on the power module 120).

In a next assembly step, the control board 160 is mounted on the power module 120. In some implementations, the mounting of the control board 160 on the power module 120 causes pins of the power module 120 to be at least partially inserted into the control board 160, and causes the one or more sensor modules 140 to be at least partially inserted in the power module 120 such that respective protrusions 206 of the one or more sensor modules 140 are through respective openings 226 in the busbars 224 of the power module 120.

Figure 3C:
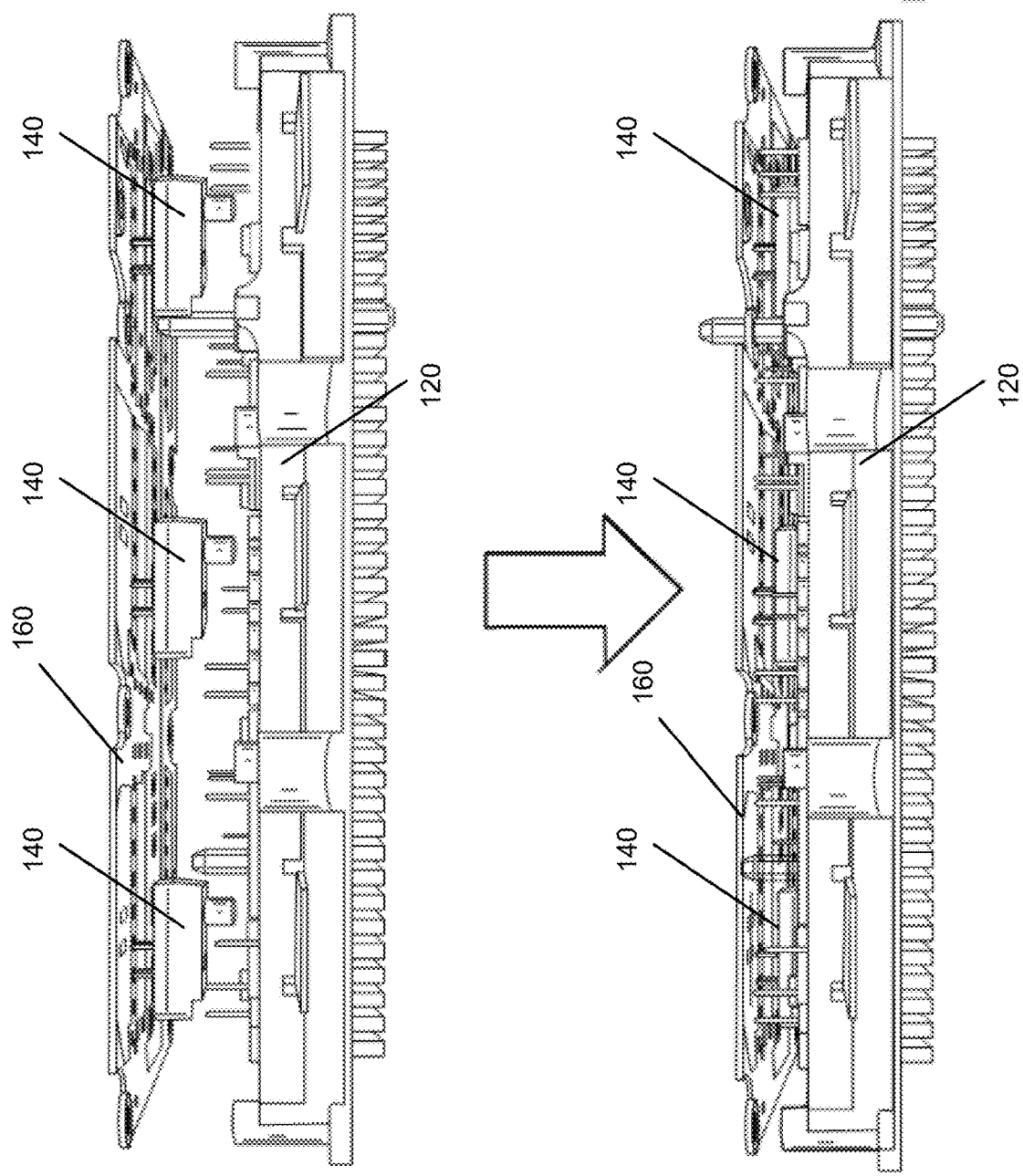
Figure 3D:
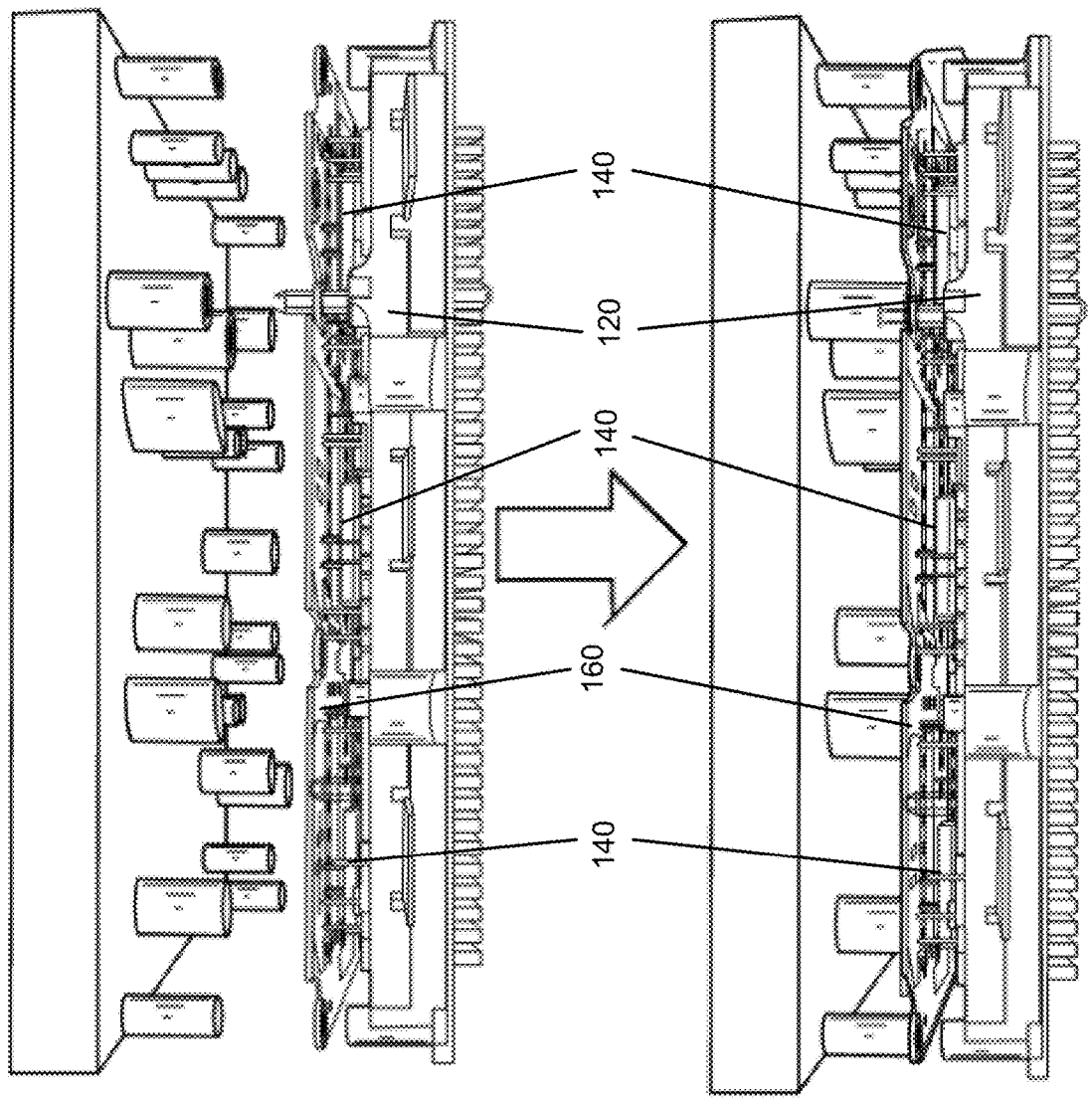

In some implementations, during the mounting of the control board 160 on the power module 120, the respective protrusions 206 of the one or more sensor modules 140 are inserted into the frame 222 of the power module 120, as shown in FIG. 3C. In some implementations, during the mounting of the control board 160 on the power module 120, an X-pin of the power module 120 guides the control board 160 such that the pins of the power module 120 are inserted into the control board 160, as shown in FIG. 3D. In some implementations, if the control board 160 is aligned to the X-pin of the power module 120, a given sensor module 140 may be slightly tilted at this assembly step. This tilt provides compensation for alignment tolerances between the opening 226 and the pins of the power module 120. The tilt of the sensor module 140 is enabled by, for example, the pivoting element 208 of the module body 202 and/or the angled element 210 of the module body 202 (when the module body 202 includes an angled facet as described above).

Figure 3E:
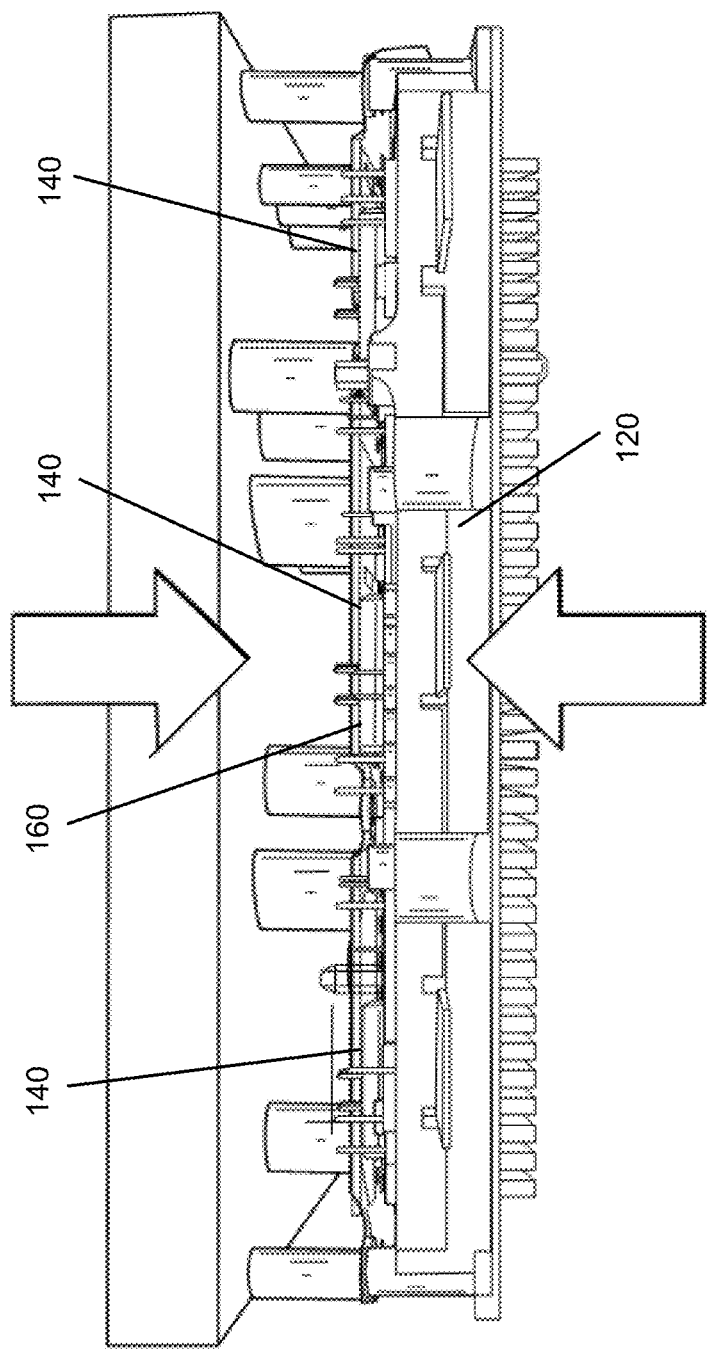

In a next assembly step, as shown in FIG. 3E, the control board 160 is pressed onto the power module 120. In some implementations, the pressing of the control board 160 onto the power module 120 causes the pins of the power module 120 to be further inserted (e.g., fully inserted) into the control board 160. In some implementations, the further insertion of the pins of the power module 120 into the control board 160 provides further plastic deformation of a pin zone within a hole of the control board 160. Notably, without such plastic deformation, a non-reliable spring contact would be provided. In some implementations, the pressing of the control board 160 onto the power module 120 causes the one or more sensor modules 140 to be further inserted in the frame 222 of the power module 120. In some implementations, the pressing of the control board 160 onto the power module 120 causes the one or more sensor modules 140 to be at a final position with respect to the control board 160. The final position of a sensor module 140 is a position at which a press fit of the protrusion 206 of the sensor module 140 in the opening 226 of the busbar 224 is provided. In some implementations, the size of the air gap between the sensor module 140 and the control board 160 may be reduced after the pressing of the control board 160 onto the power module 120 (e.g., the air gap may be eliminated). In some implementations, a size of the reduced air gap may be sufficient so as to avoid compromising electrical isolation of the sensor module 140 and the busbar 224.

In some implementations, one or more compliant pins 204 of a given sensor module 140 is plastically deformed (e.g., forming a press fit contact) while the sensor module 140 is at the final position. In some implementations, the flexibility provided by the compliant pins 204 of the sensor module 140 allows the sensor module 140 to slide or shift into the final position in the control board 160. Here, misalignment between the busbars 224 and the pins of the power module 120 is compensated by the set of compliant pins 204 of the sensor module 140. In this way, compensation for one or more mechanical tolerances is provided by a tilt of the sensor module 140 with respect to the busbar 224 and/or by a deformation of one or more compliant pins 204 of the sensor module 140.

As indicated above, FIGS. 3A-3E are provided as examples. Other examples may differ from what is described with regard to FIGS. 3A-3E.

FIG. 4 is a flowchart of an example process 400 for assembling a device including the power module 140, one or more sensor modules 140, and a control board 160 described herein.

As shown in FIG. 4, process 400 may include pressing a sensor module onto a control board such that the sensor module is at an initial position with respect to the control board (block 410). For example, a sensor module 140 may be pressed onto a control board 160 such that the sensor module 140 is at an initial position with respect to the control board 160, as described above. In some implementations, the initial position is a position at which an air gap is present between the module body 202 of the sensor module 140 and the control board 160 such that a set of compliant pins 204 of the sensor module 140 is partially inserted into the control board 160.

As further shown in FIG. 4, process 400 may include mounting the control board on a power module after the pressing of the sensor module onto the control board (block 420). For example, the control board 160 may be mounted on a power module 120 after the pressing the sensor module 140 onto the control board 160, as described above. In some implementations, the mounting the control board 160 on the power module 120 causes pins of the power module 120 to be at least partially inserted into the control board 160. In some implementations, the mounting the control board 160 on the power module 120 causes the sensor module 140 to be at least partially inserted in the power module 120 such that a protrusion 206 of the sensor module 140 is through an opening 226 in a busbar 224 of the power module 120.

As further shown in FIG. 4, process 400 may include pressing the control board onto the power module (block 430). For example, the control board 160 may be pressed onto the power module 120 the control board 160 is mounted on the power module 120, as described above. In some implementations, the pressing the control board 160 onto the power module 120 causes the pins of the power module 120 to be further inserted into the control board 160. In some implementations, the pressing the control board 160 onto the power module 120 causes the sensor module 140 to be further inserted in the power module 120. In some implementations, the pressing the control board 160 onto the power module 120 causes the sensor module 140 to be at a final position with respect to the control board 160.

Process 400 may include additional implementations, such as any single implementation or any combination of implementations described below and/or in connection with one or more other processes described elsewhere herein.

In a first implementation, one or more compliant pins 204 of the set of compliant pins 204 are elastically deformed and possibly partially plastically deformed while the sensor module 140 is at the initial position with respect to the control board 160, and are plastically deformed while the sensor module 140 is at the final position with respect to the control board 160.

In a second implementation, the sensor module 140 is tilted with respect to the busbar 224 while the sensor module 140 is at the final position with respect to the control board 160.

In a third implementation, compensation for one or more mechanical tolerances is provided by at least one of a tilt of the sensor module 140 with respect to the busbar 224 or a deformation of one or more compliant pins 204 of the set of compliant pins 204.

In a fourth implementation, the one or more mechanical tolerances include at least one of a mechanical tolerance associated with aligning the pins of the power module 120 with respect to the set of compliant pins 204 of the sensor module 140, a mechanical tolerance associated with aligning the sensor module 140 with respect to the opening 226 of the busbar 224 of the power module 120, a mechanical tolerance associated with aligning the opening 226 of the busbar 224 with respect to the pins of the power module 120, or a mechanical tolerance associated with aligning the busbar 224 with respect to another busbar 224 of the power module 120.

In a fifth implementation, the sensor module 140 being at the final position provides a press fit of the protrusion 206 of the sensor module 140 in the opening 226 of the busbar 224.

In a sixth implementation, process 400 includes aligning the control board 160 to the power module 120 after the pressing the sensor module 140 onto the control board 160 and before mounting the control board 160 on the power module 120.

In a seventh implementation, a pivoting element 208 on surface of the sensor module 140 is associated with the tilting of the sensor module 140 with respect to the busbar 224 of the power module 120 when the sensor module 140 is at the final position with respect to the control board 160.

In an eighth implementation, the sensor module 140 includes an angled element 210 that enables the tilting of the sensor module 140 with respect to the busbar 224 and the insertion of the sensor module 140 in the power module 120.

In a ninth implementation, a surface of the sensor module 140 enables the tilting of the sensor module 140 with respect to the busbar 224 and the insertion of the sensor module 140 in the power module 120 by interacting with an angled element in a frame 222 of the power module 120.

In a tenth implementation, a size of the protrusion 206 permits the protrusion 206 to be inserted in the opening 226 in the busbar 224.

In an eleventh implementation, a size of the protrusion 206 causes a press fit of the protrusion 206 in the opening 226 of the busbar 224 while the sensor module 140 is at the final position with respect to the control board 160.

In a twelfth implementation, the protrusion 206 houses isolation material associated with electrically isolating a set of sensing elements from the busbar 224.

In a thirteenth implementation, the sensor module 140 houses a core-less magnetic sensor associated with detecting a magnetic field correlated to an amount of current in the busbar 224.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A power module, comprising:
a frame including a set of sockets in which a set of sensor modules are to be inserted; and
a set of busbars, each busbar of the set of busbars passing under at least a portion of a respective socket of the set of sockets in the frame,
wherein a busbar of the set of busbars includes an opening positioned in the respective socket, the opening enabling insertion of a sensor module of the set of sensor modules in the respective socket.

2. The power module of claim 1, wherein the opening is sized to permit a protrusion on a body of the sensor module to be inserted in the opening when the sensor module is inserted into the respective socket of the set of sockets.

3. The power module of claim 1, wherein the opening is sized to provide a press fit of a protrusion on a body of the sensor module in the opening while the sensor module is at a particular position with respect to a control board.

4. The power module of claim 1, wherein the frame comprises an angled element associated with enabling tilting of a body of the sensor module with respect to the busbar.

5. The power module of claim 1, wherein the set of sockets includes three sockets and the set of busbars includes three busbars, each busbar having a respective opening.

6. The power module of claim 1, wherein the power module is configured to receive the sensor module within the respective socket as part of a process for mounting a control board on the power module.

7. The power module of claim 1, wherein pins of the power module are configured to permit the pins to be inserted into a control board as part of a process for mounting the control board on the power module.

8. A power module, comprising:
a frame including a socket, the socket sized to permit a sensor module to be inserted in the socket; and
a busbar extending under at least a portion of the socket, the busbar comprising an opening,
wherein the opening is positioned in the socket, and
wherein a size of the opening permits a portion of the sensor module to be inserted in and substantially fill the opening while the sensor module is in the socket.

9. The power module of claim 8, wherein a size of the opening permits insertion of a body of the sensor module in the socket.

10. The power module of claim 8, wherein a size of the opening enables a press fit of the portion of the sensor module in the opening.

11. The power module of claim 8, wherein the frame comprises an angled element associated with enabling tilting of the sensor module with respect to the busbar.

12. The power module of claim 8, wherein the socket is a first socket, the busbar is a first busbar, and the opening is a first opening, and
wherein frame includes a second socket sized to permit another sensor module to be inserted in the second socket,
wherein the power module includes a second busbar extending through the second socket, the second busbar comprising a second opening,
wherein the second opening is positioned in the second socket, and
wherein a size of the second opening permits a portion of the other sensor module to be inserted in the second opening while the other sensor module is in the second socket.

13. The power module of claim 8, wherein the power module is configured to receive the sensor module within the socket as part of a process for mounting a control board on the power module.

14. The power module of claim 8, wherein pins of the power module are configured to permit the pins to be inserted into a control board as part of a process for mounting the control board on the power module.

15. A power module, comprising:
a frame including a first socket, a second socket, and a third socket;
a first busbar passing under at least a portion of the first socket,
wherein the first busbar includes a first opening, the first busbar being positioned such that the first opening is in the first socket;
a second busbar passing under at least a portion of the second socket,
wherein the second busbar includes a second opening, the second busbar being positioned such that the second opening is in the second socket; and
a third busbar passing under at least a portion of the third socket,
wherein the third busbar includes a third opening, the third busbar being positioned such that the third opening is in the third socket.

16. The power module of claim 15, wherein a particular opening of a particular busbar is sized to permit a protrusion on a body of a sensor module to be inserted in and substantially fill the particular opening when the sensor module is inserted in a particular socket.

17. The power module of claim 15, wherein a particular opening of a particular busbar is sized to provide a press fit of a protrusion on a body of a sensor module in the particular opening while the sensor module is at a particular position of the sensor module.

18. The power module of claim 15, wherein the frame comprises an angled element associated with enabling tilting of a body of a sensor module with respect to a particular busbar.

19. The power module of claim 15, wherein the power module is configured to receive a sensor module within a particular socket as part of a process for mounting a control board on the power module.

20. The power module of claim 15, wherein pins of the power module are configured to permit the pins to be inserted into a control board as part of a process for mounting the control board on the power module.

* * * * *